(12) United States Patent
Hölscher et al.

(10) Patent No.: US 12,164,012 B2
(45) Date of Patent: Dec. 10, 2024

(54) COMPENSATION INTERFACE FOR A MAGNETIC RESONANCE IMAGING SYSTEM

(71) Applicant: Siemens Healthcare GmbH, Erlangen (DE)

(72) Inventors: Uvo Hölscher, Erlangen (DE); Christoph Forman, Uttenreuth (DE); Peter Gall, Uttenreuth (DE)

(73) Assignee: Siemens Healthineers AG, Erlangen (DE)

( * ) Notice: Subject to any disclaimer, the term of this patent is extended or adjusted under 35 U.S.C. 154(b) by 96 days.

(21) Appl. No.: 18/077,386

(22) Filed: Dec. 8, 2022

(65) Prior Publication Data

US 2023/0184859 A1    Jun. 15, 2023

(30) Foreign Application Priority Data

Dec. 9, 2021    (EP) .................................... 21213341

(51) Int. Cl.
   *G01R 33/54*    (2006.01)

(52) U.S. Cl.
   CPC .................................. *G01R 33/543* (2013.01)

(58) Field of Classification Search
   CPC . G01R 33/543; G01R 33/5608; G01R 33/565
   See application file for complete search history.

(56) References Cited

U.S. PATENT DOCUMENTS

| | | | |
|---|---|---|---|
| 6,801,037 B1* | 10/2004 | Zhang | G01R 33/54 324/309 |
| 2014/0125333 A1 | 5/2014 | Hanada et al. | |
| 2020/0209335 A1 | 7/2020 | O'Halloran et al. | |
| 2021/0048498 A1 | 2/2021 | Dyvorne et al. | |
| 2022/0155398 A1* | 5/2022 | Norman | G01R 33/5602 |
| 2022/0196770 A1 | 6/2022 | Forman et al. | |

FOREIGN PATENT DOCUMENTS

EP    4020166 A1    6/2022

* cited by examiner

*Primary Examiner* — G. M. A Hyder
(74) *Attorney, Agent, or Firm* — Banner & Witcoff Ltd.

(57) ABSTRACT

A magnetic resonance (MR) system compensation interface having: a hardware subinterface configured to receive individual hardware parameters from an individual scan unit of an MR system; a model determination unit configured to determine an imperfection model on the basis of the hardware parameters; a compensation model determination unit configured to determine a compensation model on the basis of the imperfection model; an application subinterface configured to receive application data assigned to an application; and a compensation unit configured to determine compensated application data on the basis of the received application data and the determined compensation model.

12 Claims, 4 Drawing Sheets

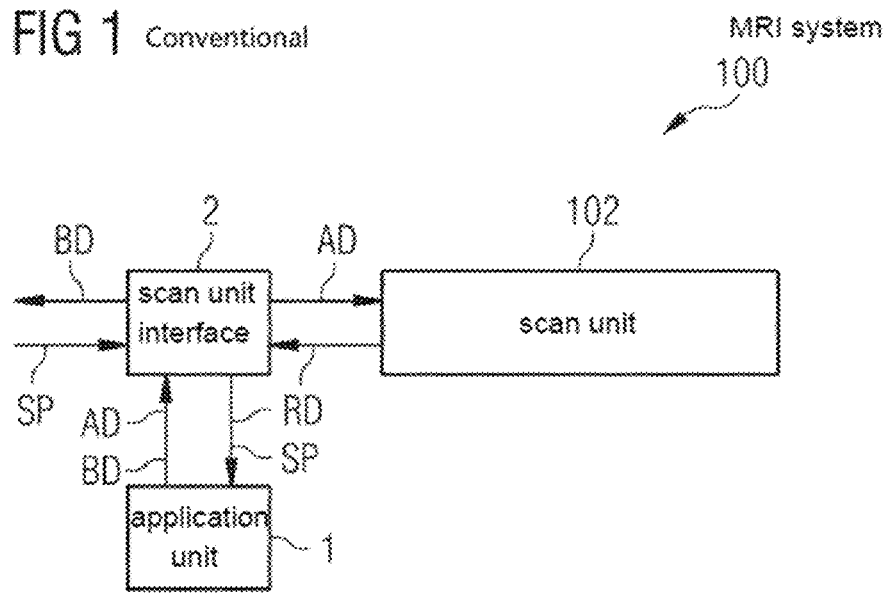
FIG 1 Conventional

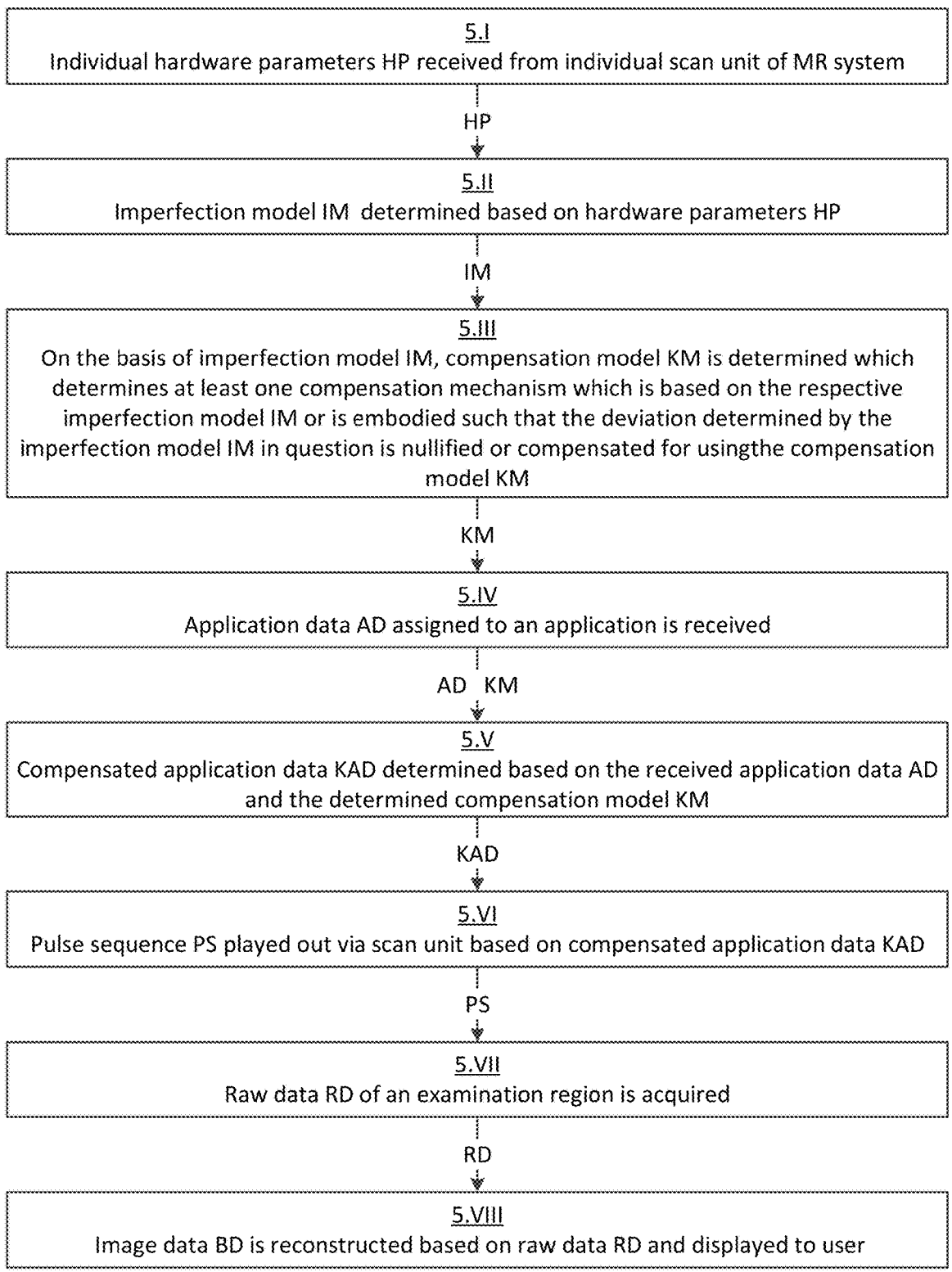

COMPENSATION INTERFACE FOR A MAGNETIC RESONANCE IMAGING SYSTEM

TECHNICAL FIELD

The disclosure relates to an MR system compensation interface. The disclosure also relates to an MR system control device. The disclosure further relates to a magnetic resonance imaging system. In addition, the disclosure relates to a method for determining a compensated control sequence for a magnetic resonance imaging system for the purpose of generating magnetic resonance image data of an examination subject.

BACKGROUND

Two- or three-dimensional image data is often generated with the aid of modern imaging methods and can be used for visualizing a patient that is to be imaged and in addition also for further applications. A particularly health-friendly imaging method, in particular because no exposure to radiation is involved, is magnetic resonance imaging.

In a magnetic resonance system, also known as a magnetic resonance tomography system, magnetic resonance imaging system or MR system for short, an examination region is typically exposed to a relatively high main magnetic field, of 0.55, 1.5, 3, 5 or 7 tesla for example, with the aid of a main field magnet system. In addition, a magnetic field gradient is applied with the aid of a gradient system. Radiofrequency excitation signals (RF signals) are then transmitted by means of suitable antenna devices via a radiofrequency transmit system, which is intended to result in the nuclear spins of certain atoms excited into resonance by means of the radiofrequency field being tipped through a defined flip angle relative to the magnetic field lines of the main magnetic field. During the relaxation of the nuclear spins, radiofrequency signals, referred to as magnetic resonance signals, are emitted, received by means of suitable receive antennas and then processed further. Finally, the desired image data can be reconstructed from the raw data acquired in the manner described.

To perform a particular measurement, it is therefore necessary to execute a specific pulse sequence consisting of a series of radiofrequency pulses, also referred to as RF pulses or HF pulses, in particular excitation pulses and refocusing pulses, as well as, fitted thereto, gradient pulses that are to be transmitted in a coordinated manner in different spatial directions. Readout windows, aligned with respect to time to the pulses, must be set which specify the time intervals in which the induced magnetic resonance signals are acquired. A critical factor for the imaging in this case is in particular the timing within the pulse sequence, i.e. in which time intervals which pulses succeed one another. A plurality of control parameters is typically defined in a set of rules called a measurement protocol, which is produced in advance with the aid of an application and retrieved for a specific measurement from a storage device, for example, and if necessary can be modified locally by the operator with the aid of the application, in which case the operator can specify by means of an input additional control parameters, such as, for example, a specific slice interval of a stack of slices that are to be measured, a slice thickness, etc. A pulse sequence, also referred to as a measurement sequence, is then calculated by the application on the basis of all these control parameters. In addition to a functionality for determining a pulse sequence, an application also comprises a functionality or algorithms serving for evaluation purposes, in particular for image reconstruction on the basis of raw data. The application may further comprise algorithms for postprocessing the image data, as well as a functionality for determining a workflow, which comprises control of processes and of the information flow between individual sequences and reconstruction processes.

In magnetic resonance imaging, there is no direct image acquisition in position space, but instead, in the first instance, magnetic resonance signals are measured, the amplitude of which can be interpreted as a Fourier transform of the image acquisition in k-space. The k-space is the spatial frequency space of the density distribution of the magnetic moments in a region that is to be examined in which MR signals are acquired. If the k-space is sufficiently sampled, the spatial distribution of the density of the magnetic moments is obtained by means of a (two-dimensional in the case of slice-by-slice sampling) Fourier transform. During the measurement, this k-space is filled with raw data which, following demodulation and digitization, corresponds to the acquired magnetic resonance signals.

An image of the examination region in position space is then reconstructed on the basis of the raw data with the aid of a Fourier transform.

The application used for the imaging therefore comprises the two components for generating and acquiring MR signals, i.e. the actual pulse sequence, and for reconstructing image data on the basis of raw data.

At the time of generating the pulse sequence it must be known which tasks of the scan unit, i.e. the transmitting of an RF pulse, the playing-out of a gradient and the acquisition of a measurement signal, are performed in which order and with which attributes, i.e. flip angle, gradient amplitude, duration of the gradients, etc. For the imaging process, a pulse sequence often plays out several thousand of these actions. Due to the high number and the thus resulting possibility of variations, an MR scan unit is able to generate a multiplicity of different image contrasts.

For the reconstruction of image data it must be known how precisely, i.e. in particular in which order and at which flip angle, the pulse sequence controls the acquisition of the measurement signals. Often the reconstruction process is based on subprocesses which comprise, for example, a Fourier transform, an algorithm for calculating gaps in the dataset during parallel imaging and an algorithm for combining signals from a plurality of receive coils. In practice, however, many other algorithms are used in addition, depending on the type of sequence used.

The magnetic resonance system used for the imaging, more specifically the scan unit of the magnetic resonance system, as well as the examination subject disposed therein, may be regarded as an ideal physical system which can be described by means of a general physical model. In such an ideal physical system, the already mentioned main magnetic field, for example, also termed the B0 field, is absolutely homogeneous, an RF pulse has the same flip angle everywhere in the examination region, or gradients are played out exactly with the time characteristic specified by a pulse sequence. The ideal physical model is therefore the same for all the scan units, i.e. all scan units behave according to this model absolutely identically given the same main magnetic field and the same played-out pulse sequence.

However, the real physical system of a scan unit does not exhibit an ideal behavior during the MR imaging process, i.e. it does not behave as would be expected according to the underlying general physical model. This deviation is due to individual "imperfections" or deviations of the respective real physical system from the ideal physical system. For example, the B0 field of an individual scan unit exhibits individual variations in the case of an individual patient, a flip angle is always location-dependent, and a played-out gradient is always deformed due to eddy currents and delayed in time due to gradient delays.

The hardware components of an individual scan unit change their temperature and consequently have different characteristic curves. Furthermore, the coil characteristics drift over time. Also, an RF pulse cannot be played out as arbitrarily short or at an arbitrarily high amplitude because the hardware of the scan unit has limits and preferred operating ranges. The cited deviations from the ideal physical model are dependent on the actual hardware components of a scan unit and the physical stature or constitution of the patient in the scan unit and therefore vary from scan unit to scan unit and sometimes even from patient to patient. They are the reason why two scan units of different types behave differently. Deviations manifest themselves even in the case of scan units of the same type, though these tend to be smaller than in the case of different types. If these deviations are not taken into account, severe artifacts and a significantly degraded image quality are the result.

In the actual application of an imaging modality using a magnetic resonance imaging system, a compensation for the deviations of the real physical system from the ideal physical system is therefore required. In particular, it is necessary to understand which effects on the pulse sequence and the image reconstruction are exerted by which deviations and how severe these effects are so that they can be compensated for more effectively.

A magnetic resonance imaging system can be assigned an architecture which abstractly describes the interaction of the functionalities of the magnetic resonance imaging system. Typically, the cited deviations are now compensated for at very different locations in the architecture. For example, certain effects, such as, for example, the compensation for deviations of the B0 field, also referred to as "shimming", are intercepted relatively closely to the hardware, without the individual pulse sequence being influenced thereby. However, many effects are also compensated for by a change in the pulse sequence or the image reconstruction. In other words, the application used for the imaging, which comprises a functionality for generating the pulse sequence and for reconstructing an image, contains special code by means of which the compensation is carried out.

Conventionally, therefore, each application has individual program code by means of which the compensation is tailored to fit the individual application. However, this approach has the disadvantage that each application comprises its own version of the nonetheless frequently very similar compensation and therefore the overhead required for programming an individual application is very high.

There are approaches involving the use of libraries for the compensation, which are accessed by a plurality of applications.

In future, however, scan units of MR systems are to have a standardized or universal interface. Such a universal interface is described in the European patent application bearing the official application number 2021 6753. The applications used for this purpose are then encapsulated individually and must not use any common libraries. This makes different applications independent of one another. However, there is a significant increase in the effort required for programming an application when adopting the conventional approach.

SUMMARY

An object is therefore to enable applications for magnetic resonance imaging to be developed as far as possible independently of one another with reduced overhead.

This object is achieved by means of an MR system compensation interface, an MR system control device, a magnetic resonance imaging system, and a method for determining a compensated control sequence for a magnetic resonance imaging system for the purpose of generating magnetic resonance image data of an examination subject.

The MR system compensation interface according to the disclosure comprises a hardware subinterface for receiving individual hardware parameters from an individual scan unit of an MR system. The hardware parameters comprise individual or type-specific data of a scan unit of an MR system which is connected with effect mechanisms that contribute to deviations from an ideal behavior of the scan unit of the MR system. Such data may comprise in particular parameters of a scan unit of an MR system or parameter values assigned to these parameters by means of which a physical model which describes the non-ideal behavior of a scan unit is specified. For example, in order to describe eddy currents of a scan unit, there can be a physical model comprising a mathematical convolutional structure in which the input signal, for example a gradient signal, is convolved such that a resulting gradient field having eddy currents is the outcome. The parameter values specific to a particular scan unit describe the actual expression of the imperfection or the actual expression of the deviating behavior from an ideal behavior of the scan unit in question. Such parameter values can be determined for example following the completion of the scan unit and prior to its shipment. However, the parameter values can also be redetermined after shipment at predetermined regular time intervals. This process can therefore be understood as a kind of calibration of the scan unit. For example, a dataset comprising numeric values for the convolution function of the imperfection model can be determined as hardware parameters for the imperfection of the eddy currents. These numbers can be determined for example during a calibration referred to as a "tune-up" in the course of an installation of the scan unit in a hospital and stored.

A further example of a deviation from an ideal behavior of a scan unit would be a hardware-induced gradient delay which has an effect in particular during MR imaging with non-Cartesian k-space trajectories due to artifacts in the reconstructed image data. The term gradient delay is intended to denote an occurrence of the gradients in the MR system that is delayed in time compared to the playing-out of the pulse sequence. This hardware-specific gradient delay can also be expressed by means of hardware parameters and received from a specific scan unit via the hardware subinterface of the MR system compensation interface.

The MR system compensation interface according to the disclosure further comprises a model determination unit which is configured to determine an imperfection model on the basis of the received hardware parameters or the hardware parameter values assigned to these. For the purpose of this determination process, the model determination unit has in each case, for each known imperfection, a physical model which describes the origin of the imperfection or the effect mechanisms causing the imperfection. As already mentioned, by applying the physical model on the basis of specific parameter values of a scan unit it is possible to determine the specific deviation of the latter from an ideal behavior.

The MR system compensation interface according to the disclosure also comprises a compensation model determination unit for determining a compensation model on the basis of the imperfection model. For each imperfection, such a compensation model describes in each case at least one compensation mechanism which is based on the respective imperfection model or is embodied precisely in such a way that the deviation determined by means of the imperfection model in question is nullified or compensated for by means of the compensation model. Thanks to the compensation model, application data is modified in such a way that an imperfection of the scan unit being controlled is at least partially compensated for. The modified application data preferably comprises input data for the scan unit of the MR system or control data which is chosen such that a desired behavior results without imperfection or with reduced imperfection of the scan unit. For example, during a desired reduction of the eddy currents, the shape of a gradient is distorted to such an extent that the resulting magnetic field exhibits a predetermined course with reduced eddy currents. The compensation of the eddy currents may be dependent not only on the hardware of the specific scan unit, but also on the type of the pulse sequence used, which can be more or less susceptible to eddy currents. Consequently, the type of the pulse sequence used must also be taken into account in the compensation. However, the application data may also comprise the reconstruction of image data, which can likewise be modified in order to compensate for or reduce imperfections of a scan unit.

Also part of the MR system compensation interface according to the disclosure is an application subinterface for receiving application data assigned to an application. The application subinterface receives application data that has not yet been modified, preferably an actual pulse sequence which first needs to be modified by the compensation interface before it is played out.

The application data, which in particular comprises the pulse sequence, is received from an application unit which generates the pulse sequence. The application subinterface is preferably also configured to conduct a dialog with an operator in order to tailor a pulse sequence and the course of the imaging to fit individual boundary conditions of an examination by inputting the already mentioned control parameters.

The modification of the pulse sequence and, where applicable, of the course of the imaging or of the application data for the reconstruction of image data takes place in a compensation unit, which is likewise part of the MR system compensation interface according to the disclosure and is configured to generate compensated application data, i.e. in particular a modified pulse sequence and, where applicable, also other modifications of the course of the imaging on the basis of the received application data and the compensation model determined by the compensation model determination unit.

It is advantageously achieved by means of the MR system compensation interface according to the disclosure that the actual application can be programmed as though there were no deviations of an individual scan unit from an ideal behavior. The scan unit can therefore be controlled by means of the application according to the perfect "physics textbook" and the compensation itself is controlled to all intents and purposes by the scan unit and by the MR system compensation interface. In addition, a dialog is conducted via the MR system compensation interface between the application and the scan unit in which it is determined which imperfections are to be compensated for and which of the imperfections can also be compensated for by means of the hardware. If necessary, the application can also be influenced via the MR system compensation interface to behave in such a way that a compensation can be applied successfully. By this is meant that a successful compensation can also be dependent on the input values supplied by the application. It may therefore also be useful to request an application to modify a pulse sequence accordingly. Even with this advantageous aspect, however, the initiative for the modification of the pulse sequence is taken by the MR system compensation interface. Advantageously, therefore, an application can initially be programmed independently of an individual piece of hardware, as a result of which considerable economies of scale and efficiency gains can be achieved.

In other words, the MR system compensation interface enables independent or encapsulated applications to use a common compensation mechanism. This approach saves a great deal of time and effort during the production of the applications.

Furthermore, a plurality of technically possibly similar or different scan units, each of which has the MR system compensation interface according to the disclosure, can be controlled by means of a single application unit, such that a true parallelism of the control actions can be achieved. Individual deviations from an ideal behavior provided as a basis by the application are compensated for locally in the individual MR system compensation interfaces of the individual scan units.

The compensation mechanisms are now relocated away from the actual applications toward the scan framework. As a result, the applications themselves are required to possess much less information about the actual scan unit hardware, which in turn makes them more independent of the actual scan unit type and other applications. Furthermore, owing to the independent programming, the applications can be transferred much more easily to new scan unit systems. Also, applications and compensation mechanisms can be developed further independently of one another. The rate of innovation is increased as a result. As will be explained in more detail later, the MR system compensation interface according to the disclosure can be embodied as a hardware unit. Such a solution permits a particularly high computing speed since an MR system compensation interface embodied in such a way can be configured with a view to its specific task. If, on the other hand, the MR system compensation interface is embodied as software, it can be more easily implemented in already existing systems without being overly supplemented by means of additional hardware.

The MR system control device according to the disclosure has an application unit acting as an application generation unit, a preferably universal scan unit interface and an MR system compensation interface according to the disclosure. As already mentioned, an application unit generates the application and executes it in the course of an imaging process. At the same time, any control data or control parameters input by a user are taken into account. Furthermore, the reconstruction of image data performed after the reception of magnetic resonance signals on the basis of the data or on the basis of the raw data resulting therefrom is also part of the application. If the scan unit interface is embodied as a universal scan unit interface, this makes it possible to standardize applications in such a way that they can be used with any scan unit having such a scan unit interface without modification or adaptation. In connection with the universal scan unit interface, reference is once again made explicitly to the European patent application bearing the official application number 2021 6753, which describes such a universal scan unit interface and is herewith incorporated in its entirety into the present patent application. The MR system compensation interface according to the disclosure effects a modification of the control action or of a control sequence generated on the basis of the pulse sequence as a function of individual deviations of the respective scan unit from an ideal behavior. The MR system compensation interface according to the disclosure can be embodied as part of the universal scan unit interface or serially with the latter, but also as parallel to the scan unit interface.

If the MR system compensation interface is embodied as parallel to the scan unit interface, the scan unit interface can be used as usual, preferably as a universal scan unit interface, without correction of or compensation for imperfections or by applications having integrated correction of imperfections. Alternatively, the MR system compensation interface can be used when applications are to be used which feature no integrated correction of the imperfections and an improvement in image quality is likely as a result of a correction of imperfections. In this case the MR system compensation interface can advantageously be used jointly by a plurality of different applications. If the MR system compensation interface is embodied as part of the scan unit interface or serially with the latter, the function of the MR system compensation interface is inserted in any case. The MR system compensation interface enables an application to be abstracted from an imperfect behavior of a scan unit. The MR system control device according to the disclosure shares the advantages of the MR system compensation interface according to the disclosure.

The magnetic resonance imaging system according to the disclosure comprises an MR control device according to the disclosure and a scan unit. The magnetic resonance imaging system according to the disclosure shares the advantages of the MR system compensation interface according to the disclosure.

In the disclosed method for determining a control sequence for a magnetic resonance imaging system for the purpose of generating magnetic resonance image data of an examination subject, individual hardware parameters are received from an individual scan unit of an MR system by means of a hardware subinterface. An imperfection model is determined on the basis of the individual or specific hardware parameters. A compensation model is then determined on the basis of the imperfection model. In addition, application data assigned to an application is received from an application unit. Compensated application data is determined on the basis of the received application data and the determined compensation model. This compensated application data is then forwarded to the individual scan unit and exhibits properties tailored to fit the individual scan unit in order to compensate for its deviation from an ideal behavior. The compensated application data can subsequently be used for controlling the scan unit and also for reconstructing image data on the basis of raw data acquired in the course of the execution of the application. The method according to the disclosure shares the advantages of the MR system compensation interface according to the disclosure.

Certain components of the MR system compensation interface according to the disclosure may be embodied for the most part in the form of software components. This relates in particular to parts of the model determination unit, the compensation model determination unit and the compensation unit.

Basically, however, these components may also be realized partly in the form of software-assisted hardware, for example FPGAs, through the application of processors or the like, in particular when there is a requirement for particularly fast calculations. Similarly, the required interfaces, such as, for example, the hardware subinterface and the application subinterface, may be embodied as software interfaces for example when it is simply a matter of importing data from other software components. However, they may also be embodied as hardware-based interfaces which are controlled by means of suitable software.

An implementation extensively realized in software has the advantage that computer systems already present hitherto in a magnetic resonance imaging system can also be easily upgraded by means of a software update following a possible expansion by means of additional hardware elements in order to operate in the manner according to the disclosure. To that extent, the object is also achieved by means of a corresponding computer program product comprising a computer program which can be loaded directly into a memory or storage device of such a magnetic resonance imaging system, having program sections for performing the steps of the disclosed method that are realizable by means of software when the computer program is executed in the magnetic resonance imaging system.

As well as the computer program, such a computer program product may where appropriate comprise additional constituent parts, such as e.g. a set of documentation and/or additional components, including hardware components, such as e.g. hardware keys (dongles, etc.) to enable use of the software.

A computer-readable medium, for example a memory stick, a hard disk drive or some other transportable or permanently installed data medium, on which the program sections of the computer program that can be read in and executed by a computer unit are stored, can serve for transporting the computer program product to the storage device of a computer unit of a magnetic resonance imaging system and/or for storing the same in the computer unit. For this purpose, the computer unit can have e.g. one or more cooperating microprocessors or the like.

The dependent claims and the following description in each case contain particularly advantageous aspects and developments of the disclosure. In this case, in particular the claims of one claims category may also be developed analogously to the dependent claims of a different claim category and the parts of the description pertaining thereto. Furthermore, the different features of different exemplary aspects and claims can also be combined within the scope of the disclosure to form new exemplary aspects.

In an aspect of the MR system compensation interface according to the disclosure, the compensation model determination unit is configured to maintain values specified by means of the application data for time sequences and time intervals of a pulse sequence of the application unchanged. This is important since in order to maintain the image quality or image contrast, the time interval between an RF pulse and a gradient must not change under normal conditions. Nor must the length in time of an RF pulse or gradient change as a rule.

Preferably, the imperfection model of the MR system compensation interface according to the disclosure comprises at least one of the following model types: a physical model and a trained model.

In many cases, a physical model can exactly describe physical effects which lead to a deviation from an ideal or universal physical model of an MR scan unit. In the simplest case, in order to tailor the physical model to fit an individual scan unit, it is only necessary to acquire hardware parameters. Consequently, the effort required to adapt the physical model to an actual piece of hardware is relatively low.

Instead of a rigid physical model, a trained model, for example comprising one or more artificial neural networks, can also be used for determining the deviations in a scan unit from an ideal or universal physical model. In this case the artificial neural networks take on either the role of an overall description of all the physical effects contributing to deviations or of only a single one of such an effect. In the latter case, an interconnection of individual artificial neural networks then leads to a totality which simulates all the imperfections relevant to the measurement. Advantageously, trained models can also be adapted to fit systems which are not fully understood by "rigid models", such as physical models, for example. Trained models are also very flexibly adaptable to match different boundary conditions.

Preferably, the imperfection model comprises a plurality of trained models, each of which is assigned to a different physical effect. Advantageously, the simulation of individual deviations can be trained. Problems with the simulation of the physical effects in this case can be detected more easily by means of the trained models.

Quite particularly preferably, the imperfection model comprises a single trained model. This variant reduces the effort required for training the model since only a single model needs to be trained.

In a variant of the MR system compensation interface according to the disclosure, the compensation model has a plurality of compensation algorithms in relation to a particular imperfection and the compensation unit is configured to select one of the compensation algorithms on the basis of the application data. For example, a first compensation model can be selected for a first application and a second compensation model can be selected for a second application which is different in respect of type from the first application. Advantageously, in spite of the universality of the MR system compensation interface, a compensation process can also be adapted to fit a specific application by selection of a compensation algorithm.

The compensation model determination unit of the MR system compensation interface according to the disclosure is therefore preferably configured to determine the compensation model among a plurality of models on the basis of the application data. In the case of the eddy currents imperfection, for example, certain applications require the played-out gradient moment to be as true as possible, during radial readout for example. Other applications impose the requirement that no eddy currents remain after a gradient, e.g. in diffusion-weighted imaging. Both requirements cannot be fulfilled in their entirety simultaneously. A specific application may therefore specify what is more important. The most suitable model can then be selected on the basis of the specific type of the application. If only a single such model is present, this can also be adapted on the basis of the specific application. Advantageously, a compensation is adapted to fit an individual application and the universality of the compensations interface and the universal applicability of the application are nonetheless maintained.

The compensation model determination unit of the MR system compensation interface according to the disclosure can be configured to determine the compensation model as a function of the compensation means of the hardware and/or as a function of software licenses. In the case of the eddy currents imperfection, all types of scan units can perform a correction by the pre-emphasis of the gradient pulses. Scan units having a higher-order shim coil can additionally use this in order to suppress or reduce eddy currents. This enables all possibilities afforded by the hardware or software to be used for compensating for imperfections.

In an aspect of the MR system compensation interface according to the disclosure, the application subinterface is embodied as a dialog interface for informing the application which compensation algorithm is available and which option can be selected or, as the case may be, which selectable option the respective compensation algorithms may possibly possess. Such a dialog interface may have technical means for exchanging data with the application or for displaying or indicating available compensation algorithms and technical means for inputting or selecting one of the available compensation algorithms. Such technical means may include for example means for automated display, acoustic notification units, dialog fields and input fields on displays, acoustic input units and similar. Advantageously, an operator can have his or her individual knowhow and requirements with regard to a compensation for imperfections included in the choice of a suitable compensation algorithm. Furthermore, the dialog interface can be embodied in such a way that an application is able itself to select automatically on the basis of the information received via the dialog interface, possibly from among a plurality of compensation algorithms, a suitable compensation algorithm which is accordingly appropriate for the specific application.

The MR system compensation interface according to the disclosure may also be embodied as a software version. This enables both the compensation mechanisms and the applications to be developed further independently of one another over the course of time.

An advantage of such a versioning approach is that in the event of a further development of the compensation mechanisms or the applications, the "old version" of the interface can continue to be available, which means that the old applications can continue to be used and no complete replacement of the applications is necessary.

In an alternative variant in contrast to that cited above, the MR system compensation interface according to the disclosure, and in this case in particular the compensation unit of the MR system compensation interface according to the disclosure, can also be embodied to change the temporal sequence and/or duration of an application incorporated in the application data, preferably the temporal sequence and/or duration of gradients and excitation pulses of the relevant pulse sequence of the application. Often, further adjustments are necessary in this case to ensure that the achieved physical effect is not changed. For example, an excitation pulse can be shortened in time if the amplitude of the excitation pulse and the amplitude of the simultaneously played-out slice selection pulse are increased. The pulse is made more robust against B0 inhomogeneities as a result of this change. If the pulse is shortened symmetrically around the temporal center of the pulse, there is no impact on the contrast of the resulting image. Advantageously, therefore, the limiting of the maintaining of the temporal sequence and/or duration of an application can be suspended in certain special cases.

The MR system compensation interface according to the disclosure can be configured to design a dialog between an operator and a preferably universal scan unit interface as a function of the determined compensation model. Generally, the preferably universal scan unit interface provides the application with information that is important for planning the sequence. This includes for example limits on RF pulses and gradients for technical reasons, limits for maximum amplitudes, "slew rates" or slopes of gradients and limits for a maximum B1 field or gradient field. These limitations relating to the hardware must be observed at the time of the generation of a pulse sequence and its modification for the purpose of compensating for individual imperfections of the scan unit.

The use of a compensation mechanism may require the preferably universal scan unit interface to make other information available than without the use of the compensation mechanism. This information can relate in particular to the limiting of sequence parameters or physical variables of the played-out pulses. If, for example, gradients are played out using a compensation mechanism, then it is necessary to prevent the sum of the gradients of application and compensation mechanism exceeding in total the capabilities or technical limitations of the scan unit. In the case of the eddy currents imperfection, the compensation, i.e. the pre-emphasis of the gradient pulses, requires values of approx. 5 mT/m. If the gradient system is able to deliver gradients at max. 45 mT/m, then the scan unit interface supplies a value of 40 mT/s as maximum value to the application if the compensation is active, and 45 mT/s if the compensation is not active.

The compensation unit of the compensation interface according to the disclosure can be configured to determine, on the basis of the individual hardware parameters and the imperfection model, which quality the compensation by means of the compensation model will possess. This information can be used by the application to adapt the sequence and the reconstruction. For example, the prediction of remaining phase errors following the compensation for eddy currents triggers the decision within the sequence whether a phase correction scan is accepted. An improvement in image contrast is advantageously achieved in this way.

DESCRIPTION OF THE DRAWINGS

The disclosure is explained once again in more detail below with reference to the attached figures and with the aid of exemplary aspects. In the figures:

FIG. 1 shows a schematic representation of a conventional magnetic resonance imaging system, FIG. 5 shows a flowchart intended to illustrate a method for determining a control sequence for a magnetic resonance imaging system for the purpose of generating magnetic resonance image data of an examination subject according to an exemplary aspect of the disclosure.

DETAILED DESCRIPTION

FIG. 1 shows a schematic representation of a conventional magnetic resonance imaging system 100. The magnetic resonance imaging system 100 comprises an application unit 1, which is programmed specifically for a particular scan unit 102. By means of the application unit 1, application data AD is generated which comprises a specific pulse sequence. The application data AD is forwarded via a scan unit interface 2 to a scan unit 102. There, gradient signals and RF signals are applied to an examination subject via a coil system and measurement signals of the examination subject are acquired. Finally, image data BD is reconstructed by the application unit 1 on the basis of raw data RD formed by means of the measurement signals and output to a user via the universal scan unit interface 2. In addition, specifying control parameters SP can be input by the user via the universal scan unit interface 2 in order to tailor the application data AD to fit specific requirements, for example individual patient data.

Figure 2:
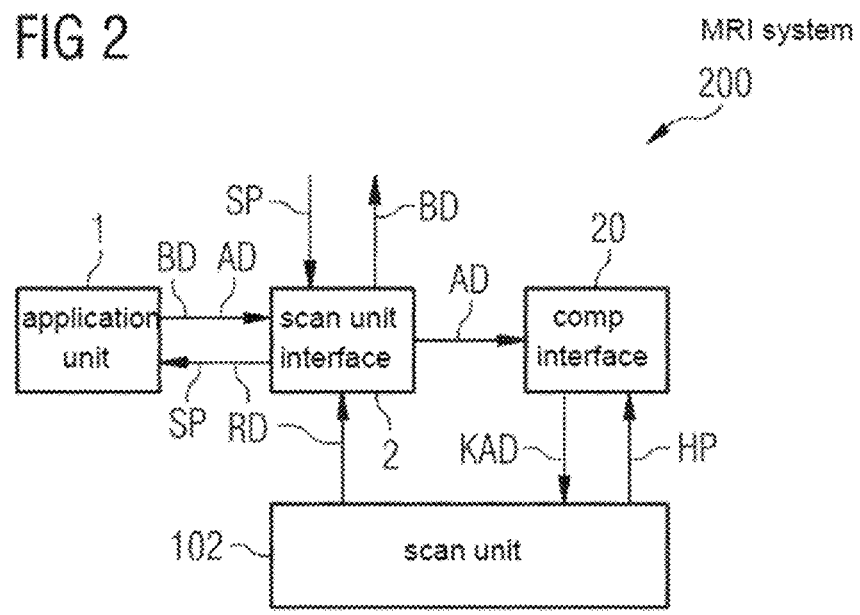
FIG. 2 shows a schematic representation of a magnetic resonance imaging system having an MR system compensation interface according to an exemplary aspect of the disclosure.

FIG. 2 illustrates a magnetic resonance imaging system 200 according to an exemplary aspect of the disclosure. Like the conventional magnetic resonance imaging system 100, the magnetic resonance imaging system 200 according to an exemplary aspect of the disclosure comprises an application unit 1 by means of which an application for the imaging of an examination subject is generated. The application data AD is transferred via a universal scan unit interface 2 to an MR system compensation interface 20 according to an exemplary aspect of the disclosure. Also, specifying control parameters SP can be input in advance by the user via the universal scan unit interface 2 in order to tailor the application data AD to fit specific requirements.

The MR system compensation interface 20 modifies the application data AD. For this purpose, it receives hardware parameters or corresponding hardware parameter values HP from a scan unit 102 of the magnetic resonance imaging system 200. On the basis thereof, compensated application data KAD is generated, on the basis of which gradient signals and RF signals are applied by the scan unit 102 via a coil system to an examination region of an examination subject. On the basis of the measurement signals captured by the coil system or on the basis of raw data RD formed by means of the measurement signals, image data BD of the examination region is then reconstructed by the application unit 1 and output to a user via the universal scan unit interface 2.

Figure 3:
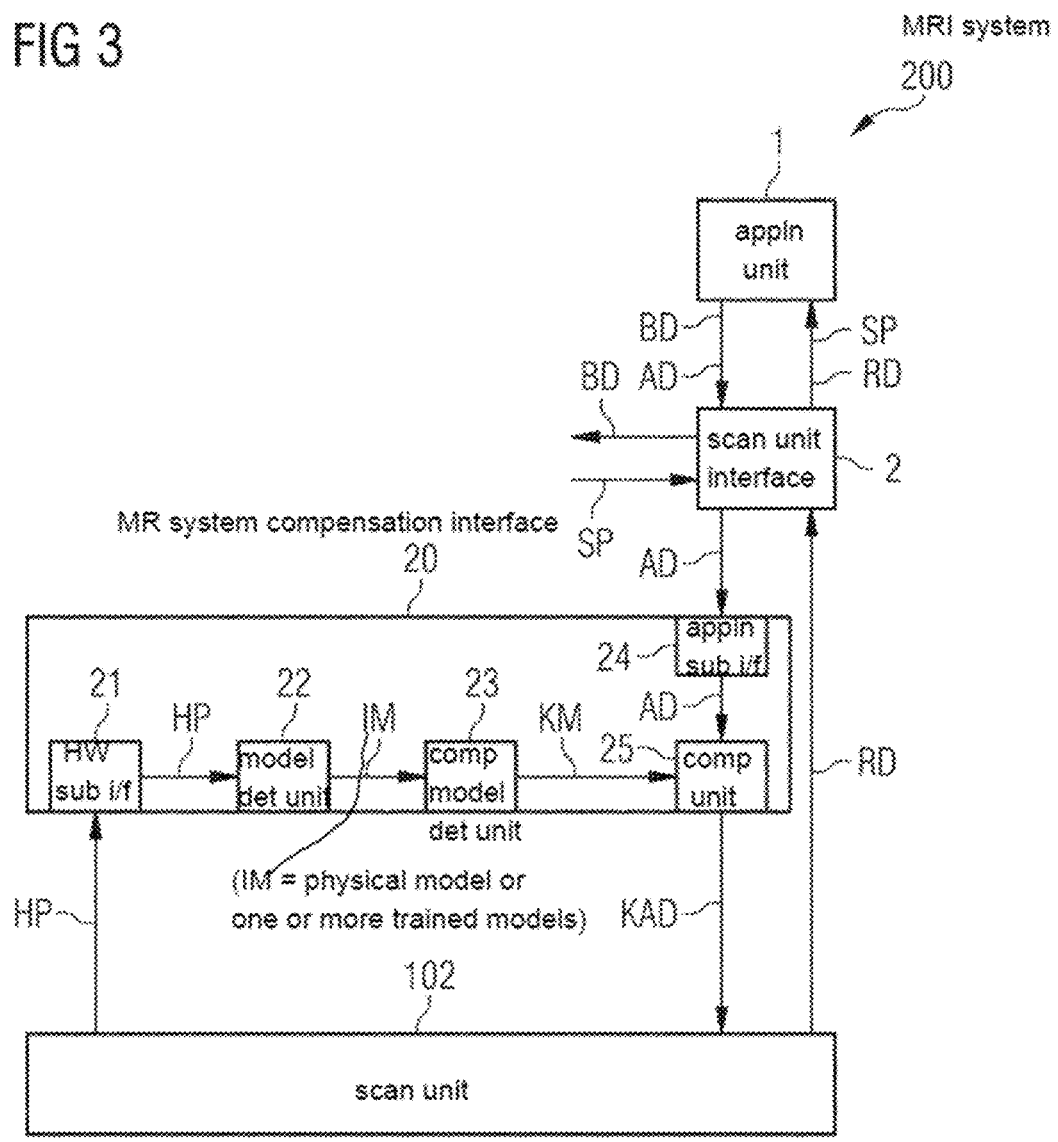
FIG. 3 shows a more detailed schematic representation of a magnetic resonance imaging system having an MR system compensation interface according to an exemplary aspect of the disclosure.

FIG. 3 shows a more detailed schematic representation of a magnetic resonance imaging system 200 having an MR system compensation interface 20 according to an exemplary aspect of the disclosure. In addition to the MR system compensation interface 20, the magnetic resonance imaging system 100 also shows the functional elements of an application 1 already illustrated in FIG. 2, of a universal scan unit interface 2 and of the scan unit 102 itself. As already mentioned, a communication can take place between the user and the application 1 via the universal scan unit interface 2 by input of control parameters SP as well as by transmission of application data AD between the application and the MR system compensation interface 20.

The MR system compensation interface 20 comprises a hardware subinterface 21 by means of which hardware parameter values HP are received from the scan unit 102 of the magnetic resonance imaging system 200. These hardware parameter values HP are used by a model determination unit 22, which is likewise part of the MR system compensation interface 20, to determine and specify an imperfection model IM. The determined and specified imperfection model IM is transferred to a compensation model determination unit 23, which generates a compensation model KM on the basis of the imperfection model IM. In addition, application data AD is received by the MR system compensation interface 20 via an application subinterface 24 likewise incorporated in the MR system compensation interface 20. Compensated application data KAD is generated by the compensation unit 25 on the basis of the received application data AD and the compensation model KM from the compensation model determination unit 23 and forwarded to the scan unit 102. On the basis thereof, gradient signals and RF signals are applied by the scan unit 102 via a coil system to an examination region of an examination subject. Image data BD of the examination region is then reconstructed by the application unit 1 on the basis of the measurement signals captured by the coil system or of raw data RD formed by means of the measurement signals and output to a user via the universal scan unit interface 2. It should be pointed out at this juncture that it is possible not only to generate compensated application data for controlling the scan unit, but also to modify functionalities or algorithms of the application that are used for reconstructing image data BD in such a way that the reconstruction is adapted to imperfections of the scan unit.

Figure 4:
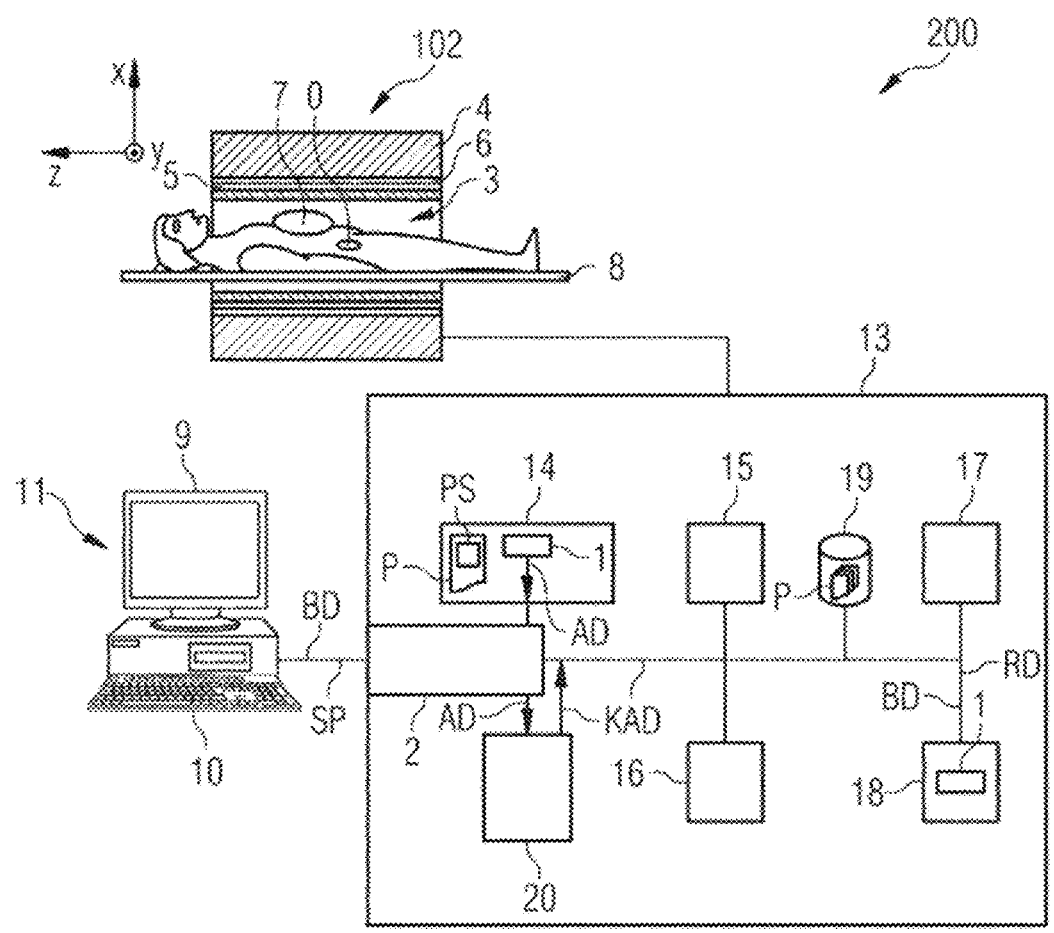
FIG. 4 shows a schematic representation of a magnetic resonance imaging system according to an exemplary aspect of the disclosure with a more detailed illustration of an MR system control device according to an exemplary aspect of the disclosure.

FIG. 4 shows a rough schematic representation of a magnetic resonance imaging system 200 according to the disclosure (referred to in the following as "MR system" for short). It comprises on the one hand the actual scan unit 102 having an examination chamber 3 or patient tunnel into which a patient O or test volunteer disposed on a couch 8, whose body contains for example a particular organ to be imaged, can be introduced.

The scan unit 102 is equipped in the usual way with a main field magnet system 4, a gradient system 6 as well as an RF transmit antenna system 5 and an RF receive antenna system 7. In the exemplary aspect shown, the RF transmit antenna system 5 is a whole-body coil permanently installed in the scan unit 102, whereas the RF receive antenna system 7 consists of local coils that are to be arranged on the patient or test volunteer (symbolized by just a single local coil in FIG. 4). In principle, however, the whole-body coil 5 can also be used as an RF receive antenna system and the local coils 7 as an RF transmit antenna system, provided the coils can be switched in each case into different modes of operation.

The MR system 200 additionally comprises, as an MR system control device according to the disclosure, a central control device 13, which is used for controlling the MR system 200. Said central control device 13 comprises a sequence control unit 14 for pulse sequence control. By means of the latter, the temporal sequence of radiofrequency pulses (RF pulses) and gradient pulses is controlled as a function of a chosen imaging sequence PS. Such an imaging sequence PS may be predefined for example within a measurement or control protocol P. Typically, different control protocols P for different measurements are stored in a storage device 19 and can be selected by an operator (and modified as required if necessary) and then used for performing the measurement. The sequence control unit 14 comprises the function of the application unit 1 illustrated in FIG. 2 and FIG. 3 for generating and playing out an imaging sequence PS in the form of application data AD.

The central control device 13 also comprises an MR system compensation interface 20 according to the disclosure, which is structured as shown in FIG. 3. On the basis of the application data AD output by the sequence control unit 14, the MR system compensation interface 20 generates compensated application data KAD, by means of which the functional units briefly described below are controlled.

In order to output the individual RF pulses, the central control device 13 has a radiofrequency transmit device 15 which generates and amplifies the RF pulses and feeds them in via a suitable interface (not shown in detail) into the RF transmit antenna system 5. The control device 13 has a gradient system interface 16 for controlling the gradient coils of the gradient system 6. The sequence control unit 14 communicates with the radiofrequency transmit device 15 and the gradient system interface 16 in a suitable manner, e.g. by transmitting application data KAD subsequently compensated for by the MR system compensation interface 20, in order to transmit the pulse sequences PS in the compensated form generated by the MR system compensation interface 20. The central control device 13 further comprises a radiofrequency receive device 17 (likewise communicating in a suitable manner with the sequence control unit 14) in order to acquire magnetic resonance signals received from the RF transmit antenna system 7 in a coordinated manner. A reconstruction unit 18, which also assumes a function of the application unit 1 shown in FIG. 2 and FIG. 3, accepts the acquired data following demodulation and digitization as raw data RD and reconstructs MR image data BD therefrom. The reconstruction of the image data can also be carried out on the basis of modified or compensated application data KAD. This enables image artifacts generated due to an imperfection for example to be reduced or even eliminated subsequently. Said image data BD can then be stored in a storage device 19, for example.

The central control device 13 can be operated via a terminal 11 having an input unit 10 and a display unit 9, via which the entire MR system 200 can therefore also be controlled by an operator. MR images can also be displayed on the display unit 9, and measurements can be planned and started by means of the input unit 10, where necessary in combination with the display unit 9, and in particular suitable control protocols containing suitable measurement sequences can be selected as explained hereinabove and if necessary modified.

Communication between the terminal 11 and the central control device 13 as well as between the application and the MR system compensation interface 20 is effected via a universal hardware interface 2. For example, control parameters SP can be forwarded to the central control device 13 via the terminal and the universal hardware interface 2 and used in the sequence control unit 14 for generating a pulse sequence or control data or application data AD based thereon.

The MR system 200 according to the disclosure and in particular the central control device 13 may additionally comprise also a plurality of further components, not described here in detail but typically present on such devices, such as, for example, a network interface in order to connect the entire system to a network and to enable the exchange of raw data RD and/or image data BD or parameter maps, as well as other data, such as patient-related data or control protocols, for example.

How suitable raw data RD can be acquired by beaming in RF pulses and generating gradient fields and how MR images BD can be reconstructed therefrom is generally known to the person skilled in the art and is not explained in further detail here. Similarly, a wide variety of measurement sequences, such as, for example, spin-echo sequences, EPI sequences (EPI=Echo-Planar Imaging), GRE measurement sequences (GRE=Gradient Echo) or TSE measurement sequences (TSE=Turbo Spin Echo) for generating dynamic or static images, are known in principle to the person skilled in the art.

FIG. 5 shows a flowchart 500 illustrating a method for determining a control sequence for a magnetic resonance imaging system for the purpose of generating magnetic resonance image data of an examination subject.

At step 5.I, individual hardware parameters HP are received from an individual scan unit of an MR system. Such hardware parameters HP provide information about actual technical/physical characteristics of the scan unit. At step 5.II, an imperfection model IM, which reproduces the non-ideal physical behavior of the individual scan unit in model form, is determined on the basis of the hardware parameters HP. At step 5.III, on the basis of the imperfection model IM, a compensation model KM is determined which determines at least one compensation mechanism which is based on the respective imperfection model IM or is embodied precisely in such a way that the deviation determined by the imperfection model IM in question is nullified or compensated for by means of the compensation model KM. At step 5.IV, application data AD assigned to an application is received. At step 5.V, compensated application data KAD is determined on the basis of the received application data AD and the determined compensation model KM. At step 5.VI, a pulse sequence PS is played out via a scan unit on the basis of the compensated application data KAD. At step 5.VII, raw data RD of an examination region is acquired. Finally, at step 5.VIII, image data BD is reconstructed on the basis of the raw data RD and displayed to a user.

In conclusion, it is pointed out once again that the above-described methods and devices are simply preferred exemplary aspects of the disclosure and that the disclosure can be varied by the person skilled in the art without leaving the scope of the disclosure to the extent that this is specified by the claims.

For the sake of completeness, it is also pointed out that the use of the indefinite articles "a" or "an" does not exclude the possibility that the features in question may also be present more than once. Similarly, the term "unit" does not rule out the possibility that this consists of a plurality of components which if necessary may also be distributed in space.

The invention claimed is:

1. A magnetic resonance (MR) system compensation interface for modifying application data, comprising:
    a hardware subinterface configured to receive individual hardware parameters from an individual scan unit of an MR system;
    a model determination unit configured to determine an imperfection model on the basis of the hardware parameters;
    a compensation model determination unit configured to determine a compensation model on the basis of the imperfection model;
    an application subinterface configured to receive the application data assigned to an application; and
    a compensation unit configured to determine compensated application data on the basis of the received application data and the determined compensation model,
    wherein the imperfection model comprises a plurality of trained models, each of which is assigned to a different physical effect.

2. The MR system compensation interface of claim 1, wherein the compensation model determination unit is configured to maintain values specified by means of the application data for temporal sequences and time intervals of the application unchanged.

3. The MR system compensation interface of claim 2, wherein the compensation unit is configured to change the temporal sequence and/or duration of an application incorporated in the application data.

4. The MR system compensation interface of claim 1, wherein the imperfection model comprises a physical model and/or a trained model.

5. The MR system compensation interface of claim 1, wherein the imperfection model comprises a single trained model.

6. The MR system compensation interface of claim 1, wherein the compensation model determination unit is configured to determine the compensation model as a function of a specific piece of hardware and/or a specific software license.

7. A magnetic resonance (MR) system control device, comprising:
    an application unit;
    a scan unit interface; and
    an MR system compensation interface as claimed in claim 1.

8. A magnetic resonance (MR) imaging system comprising an MR system control device as claimed in claim 7.

9. A magnetic resonance (MR) system compensation interface for modifying application data, comprising:
    a hardware subinterface configured to receive individual hardware parameters from an individual scan unit of an MR system;
    a model determination unit configured to determine an imperfection model on the basis of the hardware parameters;
    a compensation model determination unit configured to determine a compensation model on the basis of the imperfection model;
    an application subinterface configured to receive the application data assigned to an application; and
    a compensation unit configured to determine compensated application data on the basis of the received application data and the determined compensation model,
    wherein:
        the compensation model has a plurality of compensation algorithms in relation to a specific imperfection, and
        the compensation unit is configured to select one of the plurality of compensation algorithms on the basis of the application data.

10. The MR system compensation interface of claim 9, wherein:
    the application subinterface is configured as a dialog interface in order to inform the application and/or a user which compensation algorithm is available, and/or
    the MR system compensation interface is configured to design a dialog between an operator and a universal scan unit interface as a function of the determined compensation model.

11. A method for determining a compensated control sequence for a magnetic resonance (MR) system for generating magnetic resonance image data of an examination subject, the method comprising:
    receiving individual hardware parameters from an individual scan unit of the MR system;
    determining an imperfection model on the basis of the hardware parameters;
    determining a compensation model on the basis of the imperfection model;
    receiving application data assigned to an application; and
    determining compensated application data on the basis of the received application data and the determined compensation model,
    wherein:

the imperfection model comprises a plurality of trained models, each of which is assigned to a different physical effect, or the compensation model has a plurality of compensation algorithms in relation to a specific imperfection, and the determining compensated application data includes selecting one of the plurality of compensation algorithms on the basis of the application data.

12. A non-transitory computer program product comprising a computer program loadable directly into a memory of a control device of a magnetic resonance imaging system, having program sections for performing the steps of the method of claim 11 when the computer program is executed in the control device of the magnetic resonance imaging system.

* * * * *